United States Patent
Jones et al.

(10) Patent No.: US 10,393,618 B2
(45) Date of Patent: Aug. 27, 2019

(54) CONTROLLED PULSE GENERATION METHODS AND APPARATUSES FOR EVALUATING STICTION IN MICROELECTROMECHANICAL SYSTEMS DEVICES

(71) Applicant: FREESCALE SEMICONDUCTOR INC., Austin, TX (US)

(72) Inventors: Peter T. Jones, Scottsdale, AZ (US); Arvind Salian, Chandler, AZ (US); William D. McWhorter, Goodyear, AZ (US); Chad Krueger, Tempe, AZ (US); John Shipman, Tempe, AZ (US); Michael Naumann, Chandler, AZ (US); Larry D. Metzler, Phoenix, AZ (US); Tripti Regmi, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 414 days.

(21) Appl. No.: 15/189,892

(22) Filed: Jun. 22, 2016

(65) Prior Publication Data

US 2017/0370799 A1    Dec. 28, 2017

(51) Int. Cl.
*G01M 7/08*    (2006.01)
*B81C 99/00*    (2010.01)

(52) U.S. Cl.
CPC .............. *G01M 7/08* (2013.01); *B81C 99/005* (2013.01); *B81C 99/0045* (2013.01); *B81B 2201/0235* (2013.01)

(58) Field of Classification Search
CPC ...................................................... G01M 7/08
See application file for complete search history.

(56) References Cited

U.S. PATENT DOCUMENTS

| | | | | |
|---|---|---|---|---|
| 3,739,625 | A * | 6/1973 | Roberts | G01N 3/307 73/12.06 |
| 4,991,301 | A * | 2/1991 | Hore | G01C 9/06 324/207.15 |
| 2013/0293252 | A1 * | 11/2013 | Chen | G01R 31/2896 324/750.16 |
| 2014/0290331 | A1 | 10/2014 | Merrill, Jr. et al. | |

* cited by examiner

*Primary Examiner* — Lisa M Caputo
*Assistant Examiner* — Alex T Devito
(74) *Attorney, Agent, or Firm* — Charlene R. Jacobsen

(57) ABSTRACT

Methods and apparatuses are provided for evaluating or testing stiction in Microelectromechanical Systems (MEMS) devices utilizing a mechanized shock pulse generation approach. In one embodiment, the method includes the step or process of loading a MEMS device, such as a multi-axis MEMS accelerometer, into a socket provided on a Device-Under-Test (DUT) board. After loading the MEMS device into the socket, a series of controlled shock pulses is generated and transmitted through the MEMS device utilizing a mechanized test apparatus. The mechanized test apparatus may, for example, repeatedly move the DUT board over a predefined motion path to generate the controlled shock pulses. In certain cases, transverse vibrations may also be directed through the tested MEMS device in conjunction with the shock pulses. An output of the MEMS device is then monitored to determine whether stiction of the MEMS device occurs during each of the series of controlled shock pulses.

18 Claims, 4 Drawing Sheets

CONTROLLED PULSE GENERATION METHODS AND APPARATUSES FOR EVALUATING STICTION IN MICROELECTROMECHANICAL SYSTEMS DEVICES

TECHNICAL FIELD

Embodiments of the present invention relate generally to Microelectromechanical systems (MEMS) devices and, more particularly, to methods and apparatuses for evaluating stiction in MEMS devices utilizing a mechanized shock pulse generation approach.

BACKGROUND

Microelectromechanical systems (MEMS) devices are employed as actuators, switches, and sensors (e.g., accelerometers, gyroscopes, pressure sensors, etc.) in a broad range of applications. When utilized as a sensor, a MEMS device commonly functions by sensing changes in capacitance between stationary and movable electrodes, which are spaced apart and interleaved in, for example, a comb-type arrangement. The movable electrodes may be joined to a larger movable structure commonly referred to as a "proof mass," which is resiliently suspended over an underlying substrate by a number of elongated, flexible beams or "spring members." Depending upon the particular design of the MEMS device, the proof mass may be movable along a single axis, two perpendicular axes, or three orthogonal axes. During operation of the MEMS device, a voltage differential is applied across the stationary electrodes, the movable electrodes, or a combination thereof. As the proof mass moves in response to acceleration of the MEMS device, the movable electrodes are displaced with respect to the stationary electrodes and the capacitances between the electrodes vary accordingly. By monitoring these capacitances, changes in the acceleration or other inertia-related parameter of the MEMS device can be determined.

When containing moveable structures, a MEMS device may be subject to a fault condition known as "stiction." Stiction occurs when the movable components of a MEMS device are prevented from returning fully to their original design position after displacement due to an interfering force, such as electrostatic attraction, direct chemical bonding, or capillary forces. Stiction can occur both during in-field usage of a MEMS device and during MEMS fabrication, particularly when a wet etch is utilized to remove sacrificial layers and thereby release the movable MEMS structures. The likelihood of stiction is affected by multiple factors including the physical characteristics of the MEMS device and the environmental conditions (e.g., temperatures and humidity levels) to which the MEMS device is exposed. Several countermeasures have been developed for reducing stiction in MEMS devices, such as the application of low friction coatings over those surfaces prone to stiction. Such stiction countermeasures, however, typically only reduce (rather than eliminate) the likelihood of stiction and can add undesired cost, complexity, and duration to the MEMS manufacturing process. Regardless of whether such countermeasures are employed, it remains desirable to thoroughly and accurately assess the tendency of MEMS devices to suffer from stiction for quality control and fault analysis purposes. In this manner, stiction-prone MEMS devices can be identified and addressed prior to release into the commercial marketplace.

BRIEF DESCRIPTION OF THE DRAWINGS

At least one example of the present invention will hereinafter be described in conjunction with the following figures, wherein like numerals denote like elements, and.

Figure 1:
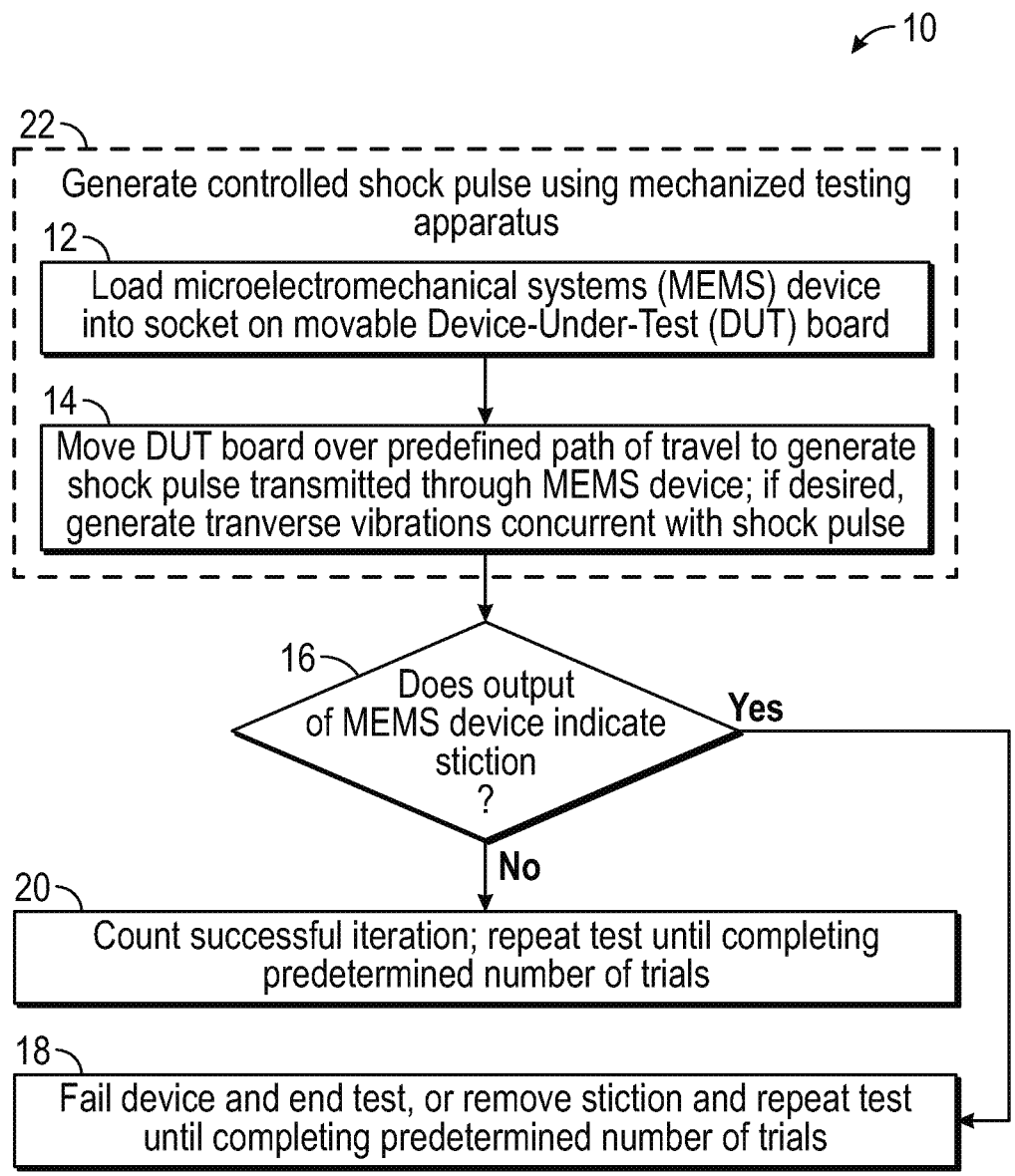
FIG. 1 is a flowchart of a method for evaluating stiction in Microelectromechanical Systems (MEMS) devices utilizing a mechanized pulse generation approach, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

Current approaches for testing MEMS stiction are often incapable of assessing the likelihood of stiction across repeated test iterations in an accurate and consistent manner. Consider, for example, one technique or test process for evaluating MEMS stiction referred to as a "soft drop test." During this test, and without implying that such an approach is employed by or publicly known by others in the industry, a personnel member or operator first loads the MEMS device into a socket located on a relatively small Printed Circuit Board (PCB). The PCB is operably coupled to a computer, which displays the signal output of the tested MEMS device. During each iteration of the soft drop test, the operator gently throws the MEMS device and the PCB into the palm of the operator's hand in, for example, an accelerated dropping motion. Impact of the PCB and MEMS device with the operator's palm generates a shock pulse, which propagates through and is detected by the tested MEMS device. The operator then references the output of the MEMS device (e.g., as displayed on the screen of a computer) to determine whether stiction has occurred. It has been found that, such a impact-generated shock pulse is sufficient to elicit stiction within stiction-prone or "highly sticky" MEMS devices with a certain degree of regularity. By successively performing a number of iterations of the soft drop test, and by monitoring the output of the MEMS device to determine if stiction occurs at each test iteration, a certain fraction of stiction-prone MEMS devices can be identified and addressed prior to release into the commercial marketplace. Quality control and customer satisfaction may be favorably improved as a result.

While allowing a fraction of stiction-prone MEMS device to be identified for quality control purposes, the above-described soft drop test is limited in several regards. By its nature, the above-described soft drop test is manually intensive and poorly controlled. Throw distance, throw velocity, device orientation upon impact, and the characteristics of the specific region of the palm impacted by the MEMS device (e.g., palm firmness and local surface geometry) can all vary between iterations of the soft drop test, even when multiple iterations of the soft drop test are performed by the same personnel member or operator in relatively rapid succession. This introduces considerable uncertainty and inaccuracy into the results of the soft drop test. Consequently, the soft drop test (and similar manually-performed MEMS stiction tests) is undesirably likely to misidentify stiction-prone MEMS devices as stiction-resistant. As a further drawback, the above-described soft drop test is relatively time consuming, incurs added labor costs, and generally does not allow multiple MEMS devices to be tested concurrently.

To overcome the aforementioned limitations, the following describes methods for evaluating MEMS stiction in a highly accurate and repeatable manner utilizing a mechanized pulse generation approach (referred to hereafter as "a mechanized shock pulse MEMS stiction test"). During the mechanized shock pulse MEMS stiction test, dedicated test equipment is utilized to generate a series of controlled shock pulses, which are transmitted through at least one tested MEMS device. MEMS output data is collected during pulse generation and analyzed to determine whether stiction occurs at each test iteration. The output data may be analyzed by an operator viewing a computer monitor on which the output data is visually expressed in, for example, a graphical or numerical format. Alternatively, the output data may be automatically analyzed by a computer executing a specialized software program, which generates a flag or another operator-notifying indicator if determining that stiction has occurred within the tested MEMS device. If stiction is avoided through a series of successively-performed test iterations, or if stiction occurs in an acceptably limited number of instances, the MEMS device is deemed sufficiently stiction-resistant to pass the MEMS stiction test. Otherwise, the MEMS device fails the MEMS stiction test and may be rejected, scrapped, subject to fault analysis, or otherwise appropriately addressed. If desired, multiple iterations of the MEMS stiction test (shock pulse generation and subsequent output signal analysis) can be performed in fairly rapid succession and/or simultaneously conducted for multiple MEMS devices to further boost process efficiency.

The MEMS stiction test can be performed utilizing any test apparatus capable of successively transmitting a series of controlled shock pulses through the tested MEMS device or devices. The shock pulses are controlled in the sense that each shock pulse is generated to have a desired amplitude, duration, and direction of propagation through the MEMS device. Such shock pulse parameters may be held constant across successive iterations of the MEMS stiction test or, instead, intentionally varied across test iterations. In many cases, however, at least the primary direction of shock pulse propagation through the tested MEMS device (or devices) is held constant across successive iterations of the MEMS stiction test and, in certain embodiments, aligned with a selected sense axis of the tested MEMS device; e.g., if a 3-axis MEMS accelerometer is tested, the mechanized test apparatus may be direct controlled shock pulses through the MEMS accelerometer primarily along the X-, Y-, or Z-axis of the accelerometer. Prior to shock pulse generation, the tested MEMS device (or devices) may be inserted into a socket provided on a carrier or support platform, which is referred to herein as a "Device-Under-Test board" or, more simply, a "DUT board." In certain embodiments, the shock pulses may be generated by striking the DUT board with a projectile, hammer, or other movable component. Alternatively, the DUT board may be moved in a manner guiding the MEMS device along a predefined, finite motion path to generate the shock pulse. In this latter case, the controlled shock pulses may be generated by abruptly halting movement of the DUT board (e.g., utilizing an actuator) when the MEMS device reaches a predefined stop position and/or by impacting the DUT board against a stop member (e.g., an elastomeric body or foam stack) located at the stop position.

It has been found that the likelihood of inducing stiction in certain stiction-prone MEMS devices can be increased if lateral or transverse vibrations are directed through the MEMS device in concert with application of the principal shock pulse. As appearing herein, the term "transverse vibrations" refers to vibrations that are propagated along at least one axis that is substantially perpendicular to the primary propagation axis of the shock pulse. Thus, in the exemplary case of a 3-axis MEMS accelerometer wherein the shock pulse is primarily transmitted along the Z-axis, the likelihood of accurately identifying a stiction-prone or highly sticky MEMS device can be improved by further inducing transverse vibrations along the X- and/or Y-axes of the MEMS device during the pulse generation process. Such transverse vibrations or lateral scrubbing action can be generated and applied to the tested MEMS device in a number of different manners. For example, the transverse vibrations can be generated by driving a movable DUT board against certain types of soft stop members (e.g., viscoelastic gel or foam stacks) that produce a lateral vibratory response or wobbling action when struck by the DUT board, by mounting a passive mechanism to the DUT board that converts a portion of the principal shock pulse into transverse vibrations, or through usage of an active vibration-generating mechanism that is controlled to generate the desired transverse vibrations during movement of the DUT board and the tested MEMS device (or devices) carried thereby. Additional description of such transverse vibration-generating techniques and devices is provided below in conjunction with FIGS. 3-6. First, however, an exemplary embodiment of the MEMS stiction test method will now be described in conjunction with FIGS. 1 and 2.

FIG. 1 is a flowchart setting-forth a method 10 for evaluating stiction in MEMS devices utilizing a mechanized shock pulse approach, as illustrated in accordance with an exemplary embodiment of the present disclosure. MEMS stiction test method 10 includes a number of process STEPS

12, 14, 16, 18, and 20, with STEPS 12 and 14 performed as part of a larger PROCESS BLOCK 22. Depending upon the manner in which method 10 is implemented, each step generically illustrated in FIG. 1 may entail a single process or multiple sub-processes. Furthermore, the steps illustrated in FIG. 1 and described below are provided by way of non-limiting example only. In alternative embodiments of MEMS stiction test method 10, additional process steps may be performed, certain steps may be omitted, and/or the illustrated steps may be performed in alternative sequences. While the following describes method 10 in conjunction with the testing of a single MEMS device for ease of explanation, it will be appreciated that multiple MEMS devices may be tested concurrently (e.g., utilizing a common test apparatus including one or more DUT boards, which each support multiple MEMS devices) for increased process efficiency.

MEMS stiction test method 10 commences at PROCESS BLOCK 22 during which a controlled shock pulse is generated and propagated through at least one tested MEMS device. In this regard, the tested MEMS device may be initially loaded onto or securely mounted to a DUT board included within a test apparatus (STEP 12, FIG. 1). As indicated by the term "board," the DUT board will often have a relatively thin, board-like form factor and may be fabricated, in whole or in part, from a PCB. It is not essential, however, that the DUT board has such a form factor or that the DUT board has a PCB-based construction in all embodiments. Instead, the DUT board can be any carrier, platform, shuttle, support structure, or the like capable of maintaining the tested MEMS device (or devices) in a desired position and orientation during successively-performed iterations of MEMS stiction test method 10. Additionally, while the following describes embodiments of MEMS stiction test method 10 wherein the DUT board is repeatedly moved over a finite motion path to generate the desired shock pulses, it is noted that the DUT board may remain stationary in further embodiments of the MEMS stiction test method, while controlled shock pulses are generated by impacting the DUT board with a hammer, projectile, or other mechanized component.

As indicated above, the tested MEMS device can be mounted to the DUT board in any manner securely retaining the tested MEMS device in a desired position and orientation, while further permitting signal communication with the MEMS device. In one embodiment, the DUT board is equipped with a socket to which the MEMS device pilots or physically registers. The socket permits power transmission to and the receipt of signals from the MEMS device during test method 10. In many cases, the socket will be a multi-pin connector or other input/output (I/O) interface into which tested MEMS devices can be freely plugged, unplugged, and interchanged with similar MEMS devices. The DUT board may further include a wired connection (e.g., a flexible circuit connector) to provide signal communication with an associated controller or computer system utilized in evaluating or assessing the MEMS output data to determine whether stiction occurs at each test iteration. In other embodiments, the output data of the tested MEMS device may be wirelessly transmitted to a signal-monitoring controller or computer system utilizing, for example, a wireless transceiver carried by the DUT board.

Next, at STEP 14 of MEMS stiction test method 10 (FIG. 1), a mechanized test apparatus is utilized to guide movement of the DUT board such that a vector-controlled shock pulse is directed through the tested MEMS device. A test apparatus is considered "mechanized" in the context of the document when the test apparatus includes mechanical components (and possibly, but not necessarily an actuator) that direct at least one tested MEMS device over a prescribed path of motion, as described more fully below. Any combination of driving forces can be utilized to urge movement of the DUT board over the predefined motion path including, but not limited to, an actuator force, gravitational forces (which may be enhanced by adding bulk weight to the DUT board), and/or resilient bias forces, such as mechanical or gas spring bias forces. In certain embodiments, an elongated DUT board may be rotated to move the MEMS device over an arcuate motion path, as described below in conjunction with FIGS. 3-5. In other embodiments, the DUT board and the MEMS device may be moved over a linear motion path by a linear actuator, such as voice-coil based actuator of the type described below in conjunction with FIG. 6. At a stop position of the motion path, a controlled shock pulse may be created by impacting the DUT board against a soft stop member, such as viscoelastic body (e.g., a rubber piece) or a multi-layer stack of compressible materials. Alternatively, an actuator may be utilized to accelerate the DUT board over its range of travel and then abruptly halt motion of the DUT board at a predefined stop position in a manner directing a controlled shock pulse through the tested MEMS device.

The shock pulse generated during STEP 14 of MEMS stiction test method 10 (FIG. 1) is controlled to elicit a desired response from the tested MEMS device. In certain instances, the desired response from the MEMS device may be graphically expressed as a half-sine acceleration pulse, which has a peak amplitude and pulse width falling within targeted ranges. In one embodiment, and by way of non-limiting example only, the peak amplitude range may be between about 50 and 200 G, while the desired pulse width range may be between about 5 and 20 milliseconds. As described more fully below, STEP 14 of MEMS stiction test method 10 is repeatedly performed (along with STEPS 16, 18, and 20 of test method 10) such that a series of shock pulses is directed through the tested MEMS device. The characteristics of the successively-generated shock pulses may be held constant between iterations of MEMS stiction test method 10 or may instead be purposefully varied; e.g., the amplitude of the shock pulse may be increased or decreased in a stepwise manner as successive iterations of MEMS stiction test method 10 are performed. Shock pulse generation may be carried-out in either an open air environment or, instead, in a closed, controlled environment. For example, in one implementation, shock pulse generation may be carried-out in a closed chamber to permit regulation of environmental conditions influencing the likelihood of stiction, such temperature and humidity levels.

Output data is gathered from the tested MEMS device during and/or immediately following each shock pulse event. At STEP 16 of MEMS stiction test method 10, the output data of the tested MEMS device is analyzed to determine whether stiction has occurred as a result of the shock pulse. In certain implementations, this determination can be manually rendered by a personnel member or operator performing a relatively quick data analysis process. Specifically, the operator may reference a computer screen or monitor on which the MEMS output data is visually displayed in, for example, a graphical or numerical format. The operator may then decide whether displayed the MEMS output data indicates that stiction has occurred. An example of the MEMS output data that may be generated pursuant to shock pulse generation and the manner in which this data may be displayed and analyzed is described more fully below in conjunction with FIG. 2. Alternatively, the determination of whether stiction has occurred pursuant to shock pulse generation can be automated to varying extents. For example, the determination of whether stiction has occurred may be automatically rendered utilizing a controller or computer system executing a specialized software program. In this latter case, the computer system may generate a flag (e.g., a visual alert displayed on a screen of the computer) or otherwise notify an operator or other personnel member when stiction occurs pursuant to shock pulse generation. Otherwise, the computer system may continually perform the shock pulse generation and analysis process until determining that the tested MEMS device (or devices) has passed MEMS stiction test method 10.

If stiction occurs during a given iteration of MEMS stiction test method 10, an appropriate course of action is taken (STEP 18, FIG. 1). The tested MEMS device may be immediately rejected, removed for fault analysis, or otherwise addressed upon the first occurrence of stiction. Alternatively, the tested MEMS device may undergo additional iterations of MEMS stiction test method 10 to determine whether stiction reoccurs prior to rejecting the device. This may require removal of the stiction by, for example, applying a tapping or vibratory force to the MEMS device sufficient to dislodge the surfaces subject to stiction. In embodiments wherein a tested MEMS device has been selected as a representative of a larger lot of devices and the tested MEMS device fails to pass MEMS stiction test method 10, a larger portion of the device lot or the entire device lot may be subject to additionally stiction testing. Finally, if stiction does not occur during STEP 16 of MEMS stiction test method 10, a successful test iteration is tallied (STEP 20, FIG. 1). STEPS 14, 16, 18, and 20 of MEMS stiction test method 10 are then repeated for a predefined number of trials or iterations. If the MEMS device passes a predefined number of trials without exhibiting stiction or while exhibiting stiction in an acceptably limited number of instances, the MEMS device is deemed sufficiently stiction-resistant to pass test method 10. The MEMS device may then be removed from the DUT board and released into the commercial marketplace, if so desired.

Figure 2:
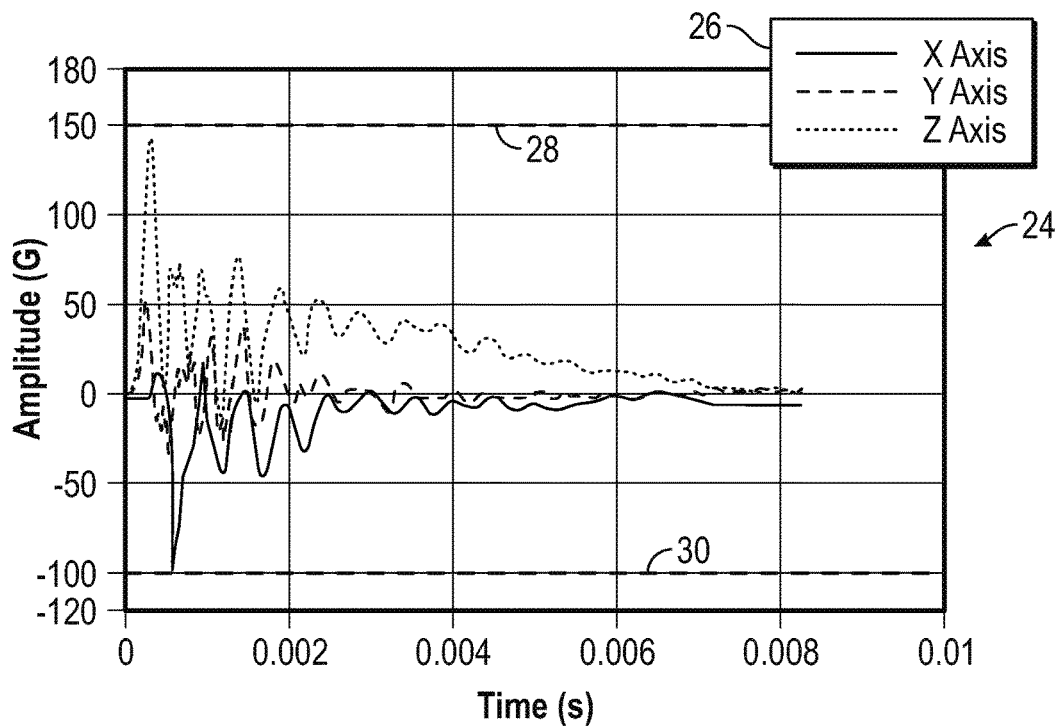
FIG. 2 is a graph plotting a sample output of a 3-axis MEMS accelerometer, which may be generated during an exemplary iteration of the stiction test method of FIG. 1.

FIG. 2 illustrates a graph 24 plotting a sample of MEMS output data, which may be collected and analyzed during an iteration of MEMS stiction test method 10 (FIG. 1) when carried-out utilizing a 3-axis MEMS accelerometer. Amplitude is plotted along the ordinate or vertical axis of graph 24, while time is plotted along the abscissa or horizontal axis. Three traces or characteristics are shown, each representing of an output of the accelerometer along a different sense axis (identified by key 26 shown in the upper right corner of FIG. 2). As indicated by the graphed output data, a vibrational response has been elicited from the tested MEMS device along all three sense axis pursuant to application of the controlled shock at STEP 14 of MEMS stiction test method 10 (FIG. 1). In this particular example, each trace follows a generally sinusoidal wave pattern, which gradually tapers toward zero amplitude within the illustrated timeframe as the shock pulse dissipates and ultimately passes. This is a desired or expected response indicating that stiction has not occurred within the tested MEMS device. Thus, in keeping with the example of FIG. 1, an operator, computer system, or automated logic module analyzing this MEMS output data set would appropriately determine that stiction has not occurred, and MEMS stiction test method 10 would advance to STEP 20 (FIG. 1).

The appearance of the sample MEMS output data, as plotted in graph 24, would vary if stiction occurred within the tested MEMS device pursuant to application of the controlled shock. If stiction were to occur pursuant to shock pulse generation, the tested MEMS device may respond with one or more railed outputs. With continued reference to graph 24 (FIG. 2), such a railed output may manifest graphically as one or more of the X-, Y-, and Z-traces remaining at or near their respective maximum or minimum amplitudes over the graphed time period. For example, if the Z-axis trace remained at its maximum amplitude (as indicated by dashed line 28 in FIG. 2), or if the X-axis trace remained at its minimum amplitude (as indicated by dashed line 30), it may be concluded that stiction has occurred during the present iteration of MEMS stiction test method 10. Again, this determination may be rendered by an operator viewing a computer screen on which graph 24 is generated, by a computer executing an appropriate software application, or in another manner. Accordingly, MEMS stiction test method 10 (FIG. 1) would then progress to STEP 18 and proceed as previously described.

Notably, the effectiveness of MEMS stiction test method 10 in identifying stiction-prone MEMS devices may be increased by directing transverse vibrations through the tested MEMS device during STEP 14 of method 10 (FIG. 1). As briefly indicated above, such transverse vibrations (the corresponding response of the MEMS device also referred to herein as a "lateral scrubbing action") are vibrations that primarily propagate along at least one axis that is perpendicular to the axis along with the principal shock pulse propagates. It is thus advantageous, although not essential, that such transverse vibrations are directed through the tested MEMS device in conjunction with application of the principal shock pulse. Generally, the transverse vibrations will have a peak amplitude that is less than the peak amplitude of the principal shock pulse, as measured along primary propagation axis of the principal shock pulse. In certain embodiments, the tested MEMS device may be guided along a motion path (e.g., by movement of the DUT board) such that, at the predefined stop position of the DUT board, the MEMS device is imparted with a velocity vector substantially aligned with a chosen sense axis of the MEMS device. Concurrently, lower amplitude transverse vibrations may be directed through the MEMS device along one or more axes perpendicular to the chosen sense axis. Consider again the sample MEMS output data plotted in graph 24 (FIG. 2). In this example, movement of the DUT board has been halted in a manner directing the principal shock pulse through the tested MEMS device along a selected sense axis (in this case, the Z-axis), while lower amplitude transverse vibrations have also been directed through the MEMS device along the X- and Y-axes. Different mechanisms or test apparatuses suitable for producing such a controlled principal shock pulse in concert with accompanying transverse vibrations will now be described in conjunction with FIGS. 3-6.

Figure 3:
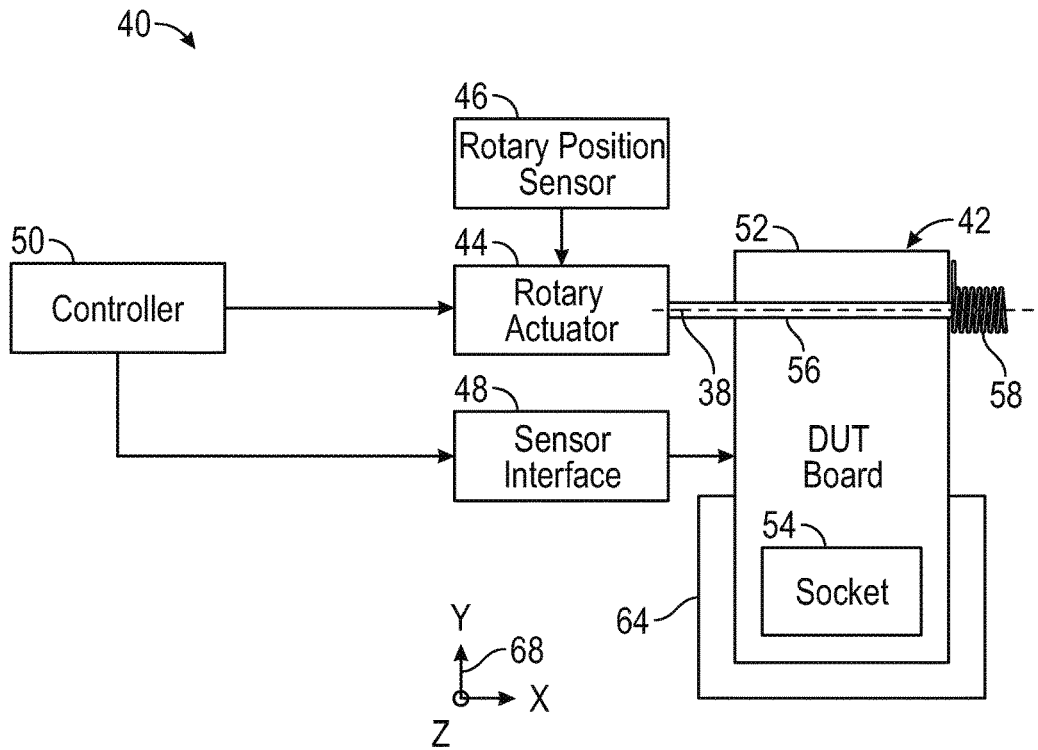
FIG. 3 is a schematic representation of a first lever arm test apparatus, which can be utilized to transmit a series of controlled shock pulses through a tested MEMS device during the mechanized shock pulse MEMS stiction test method of FIG. 1 and which is illustrated in accordance with a further exemplary embodiment of the present disclosure.

FIG. 3 is a schematic representation of a mechanized MEMS stiction test apparatus 40 suitable for carrying-out embodiments of MEMS stiction test method 10 (FIG. 1), as illustrated in accordance with embodiments of the present disclosure. In the illustrated example, MEMS stiction test apparatus 40 includes the following major components or devices: (i) a lever arm test assembly 42, (ii) a rotary actuator 44 mechanically coupled to lever arm test assembly 42, (iii) a position sensor 46 coupled to rotary actuator 44, (iv) a sensor interface 48 coupled to lever arm test assembly 42, and (v) a controller 50 operably coupled to rotary actuator 44 and further operably coupled to lever arm test assembly 42 through sensor interface 48. Each of the aforementioned devices can be comprised of any number of individual components, structures, or pieces of equipment capable of performing the functions described herein. Controller 50, in particular, can be implemented utilizing any suitable number of individual microprocessors, navigational equipment, memories, power supplies, storage devices, interface cards, and other standard components known in the art. Additionally, controller 50 may include or cooperate with any number of software programs or instructions designed to carry out the various methods, process tasks, calculations, and control functions described herein. Mechanized MEMS stiction test apparatus 40 can and typically will include various other components (e.g., a power supply) that are not shown in FIG. 3 to avoid unnecessary obscuring the drawing.

Figure 4:
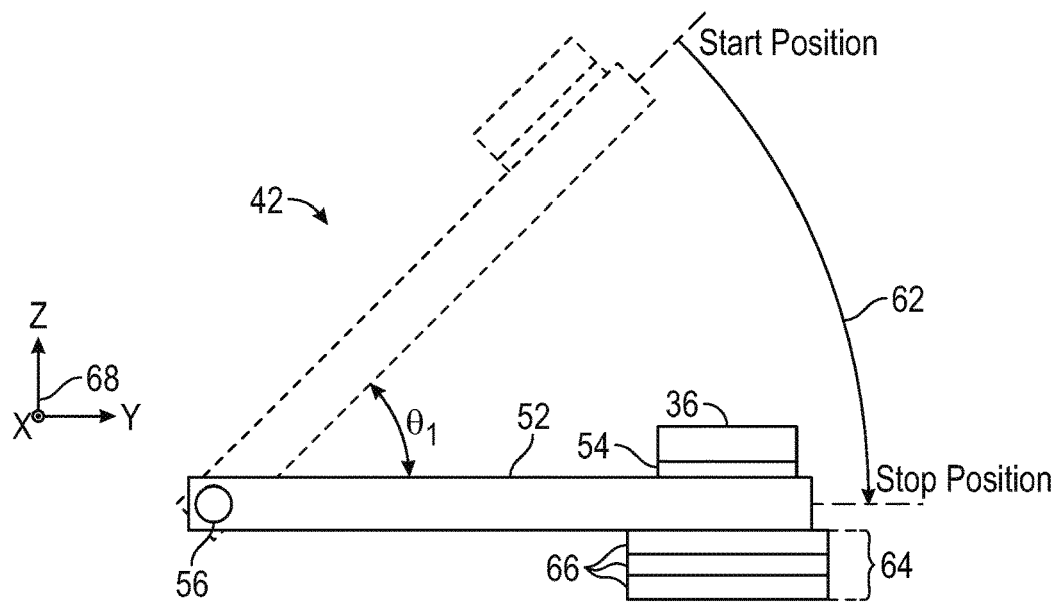
FIG. 4 is a side view of an exemplary lever arm test assembly that can be included in the lever arm test apparatus shown in FIG. 3 in an embodiment.

FIG. 4 is a simplified side view of lever arm test assembly 42 included within exemplary mechanized MEMS stiction test apparatus 40 (FIG. 3). Referring jointly to FIGS. 3 and 4, lever arm test assembly 42 contains an elongated DUT board 52, an I/O socket 54, a shaft 56, and a torsion spring 58 (FIG. 3). I/O socket 54 is provided on first end portion of DUT board 52, while the opposing end portion of board 52 is joined to shaft 56 in a rotationally fixed relationship. Shaft 56 can be mechanically coupled to or integrally formed with the rotary output of actuator 44, which may be a stepper motor in an embodiment. Actuator 44 can be controlled to rotate shaft 56 and, therefore, DUT board 52 about a rotational axis 38 (FIG. 3) from a stop position (shown in FIGS. 3 and 4) to a start position (shown in phantom in FIG. 4). Torsion spring 58 (FIG. 3) biases elongated DUT board 52 toward the predefined stop position and, thus, is deflected as DUT board 52 is rotated away from the stop position in the manner described below. In further embodiments, a different mechanism (e.g., a different type of mechanical or gas spring) may be utilized to bias the DUT board 52 toward the stop position of the DUT board's finite motion path.

During each iteration of MEMS stiction test method 10 (FIG. 1), controller 50 commands rotary actuator 44 to rotate DUT board 52 to its predefined start position, as indicated in phantom in FIG. 4. To ensure that DUT board 52 is precisely returned to the start position during each iteration of the MEMS stiction test, position sensor 46 (e.g., a rotary encoder) is utilized to monitor the angular position of shaft 56 and DUT board 52. From the stop position, actuator 44 may rotate DUT board 52 to a predefined angle $\theta_1$ in a first (e.g., generally upward) direction to place board 52 in the start position (again, shown phantom in FIG. 4). In one embodiment, angle $\theta_1$ is between 15 and 90 degrees (°). Angle $\theta_1$ may be greater than or less than the aforementioned range in other implementations. In further embodiments, the start position can be set utilizing a physical stop member; e.g., in this case, actuator 44 can raise or otherwise rotate DUT board 52 until contacting the stop member. Rotational axis 38 is a substantially horizontal in the illustrated example, and the fully articulating end of DUT board 52 is raised when DUT board 52 is rotated into the start position. In further embodiments, DUT board 52 may be rotated along a different axis such that, for example, DUT board 52 travels along a horizontal plane parallel with the plane of the floor.

After DUT board 52 is rotated into the start position (FIG. 4), controller 50 commands rotary actuator 44 to release shaft 56. DUT board 52 then rapidly accelerates and returns to the stop position under the resilient bias force of torsion spring 58. Rotation of DUT board 52 about axis 38 from the start position to the end position guides movement of a tested MEMS device 36 (FIG. 4) loaded into socket 54 along an arcuate path, as represented in FIG. 4 by arrow 62. As DUT board 52 rotates into the stop position, the underside of board 52 contacts a soft stop member 64 to halt the motion of board 52 and generate a shock pulse transmitted through MEMS device 36. MEMS device 36 may be located substantially over soft stop member 64 when DUT board 52 rotates fully into the stop position. When driving DUT board 52 against soft stop member 64 in this manner, controller 50 monitors the output of tested MEMS device 36 (FIG. 4) through DUT board 52 and sensor interface 48 (e.g., FRDM-brand board sensor toolbox USB-12C interface). The output data retrieved from MEMS device 36 is then analyzed to determine whether stiction has been induced with MEMS device 36, as described above in conjunction with QUERY STEP 16 of MEMS stiction test method 10 (FIG. 1). The foregoing process steps are then repeated, as appropriate, to conduct successive iterations of MEMS stiction test method 10. If desired, mechanized test apparatus 40 can be configured to perform multiple quick motions repeatedly driving DUT board 52 against soft stop member 64 until, for example, stiction is detected or a predefined number of test iterations is successfully carried-out without inducing stiction within MEMS device 36 (FIG. 4).

In the embodiment shown in FIGS. 3 and 4, a soft stop member 64 is positioned underneath DUT board 52 to arrest movement of board 52 when tested MEMS device 36 reaches the predefined stop position. As generically illustrated in FIG. 4, soft stop member 64 may be produced from a multi-layer stack of compressible materials 66. Material layers 66 may include different combinations of polyurethane memory foam, silicone foam rubber, and other compressible materials. In another embodiment, soft stop member 64 is composed of or includes at least one layer of elastomeric material, such as a ballistic gel. It has been found that including at least one layer of ballistic gel, elastomeric foam, or a similar material within DUT board 52 may help generate transverse vibrations upon contact with DUT board 52. Such materials may exhibit a transverse vibrational response or wobbling motion when struck by DUT board 52 with adequate force. In this regard, and referring to coordinate legend 68, MEMS device 36 may travel in a direction substantially aligned with or parallel to the Z-axis when halted by contact between DUT board 52 and soft stop member 64. The principal shock pulse thus correspondingly travels through MEMS device 36 along a primary propagation axis that is aligned with or parallel to the Z-axis (or other chosen sense axis) of device 36. Substantially concurrently, lateral movement of soft stop member 64 (a lateral shaking or wobbling motion) is created by impact of DUT board 52 with the upper surface of member 64. Such lateral movement is transmitted through DUT board 52 and to tested MEMS device 36. As a result, lower amplitude transverse vibrations are generated and transmitted through MEMS device 36 along the X- and Y-axes to induce the desired lateral scrubbing action within device 36 enhancing the sensitivity of the MEMS stiction test.

There has thus been described at least one exemplary embodiment of a MEMS stiction test apparatus suitable for directing highly controlled shock pulses through a tested MEMS device. In the above-described example, transverse vibrations were generated concurrently with application of the principal shock pulse by impacting a DUT board against a body or stack of compressible materials, such as a stack of compressible materials including at least one viscoelastic (e.g., ballistic gel) layer that responds with a wobbling or shaking when struck by the DUT board. In further implementations of the mechanized shock pulse MEMS stiction test method and testing apparatuses, the desired transverse vibrations (if generated at all) may be generated in another manner, such as through the usage of a discrete transverse vibration-generating mechanism. In some implementations, the transverse vibration-generating mechanism can be passive by design and may function by converting a portion of the principal shock pulse into the transverse vibrations transmitted to and through the tested MEMS device (or devices). An example of a MEMS stiction test apparatus including such a passive transverse vibration-generating device will now be described in conjunction with FIG. 5.

Figure 5:
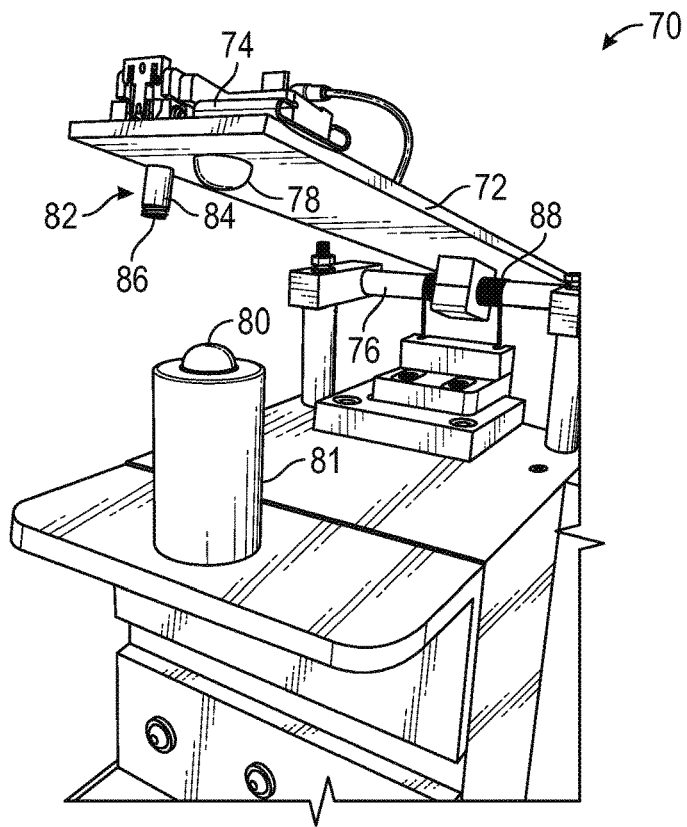
FIG. 5 is an isometric view of a second exemplary lever arm test apparatus similar to the test apparatus shown in FIG. 3 and further including a passive transverse vibration-generating mechanism.

FIG. 5 is an isometric view of a lever arm test assembly 70, which may be utilized in place of lever arm test assembly 42 (FIGS. 3 and 4) within mechanized MEMS stiction test apparatus 40 in a further exemplary embodiment thereof. As does lever arm test assembly 42 (FIGS. 3 and 4), lever arm test assembly 70 includes an elongated DUT board 72, an I/O socket 74 provided on a first end portion of board 72, and a shaft 76 to which the opposing end portion board 72 is affixed. Additionally, as was previously the case, DUT board 72 is rotatable about a rotational axis from a set start position (shown in FIG. 5) to a stop position. However, in contrast to lever arm test assembly 42 (FIGS. 3 and 4), lever arm test assembly 70 further includes a first and second soft stop members 78, 80. First soft stop member 78 is mounted to the underside of DUT board 72 at location substantially opposite or underneath the MEMS-receiving socket located on the upper surface of board 72. Comparatively, second soft stop member 80 is mounted to the upper end of a freestanding pillar or post 81, which projects upwardly from a lower portion of the test apparatus in a vertical direction. Soft stop members 78, 80 are composed of a material having a carefully selected or tuned compressibility or softness, such as a relatively dense rubber having a specified durometer. Soft stop members 78, 80 are positioned to contact when elongated DUT board 72 is rotated from the start position (shown) into the stop position under the influence of a torsion spring 88 coupled to an end of the DUT board 72. As indicated in FIG. 5, soft stop members 78, 80 are each advantageously imparted with a substantially hemispherical shape or rounded geometry. This helps to ensure that contact between soft stop members 78, 80 repeatedly occurs at a single, localized contact point when DUT board 72 is rotated into the stop position. Additionally, due to the usage of such soft stop members 78, 80 in place of a soft stop member having a relatively large, planar surface that directly contacts the underside (or other surface) of the DUT board, any undesired aerodynamic effects may be reduced or eliminated to improve consistency between iterations of MEMS stiction test method 10.

In the exemplary embodiment shown in FIG. 5, DUT board 72 is further equipped with a passive transverse vibration-generating mechanism 82. Lateral vibration-generating mechanism 82 is mounted to the underside of DUT board 72 at a location proximate or laterally adjacent soft stop member 78. Lateral vibration-generating mechanism 82 can assume any form suitable for converting a portion of primary shock pulse generated by contact of soft stop members 78, 80 into lower amplitude transverse vibrations, which are then transmitted through DUT board 72 and the tested MEMS device carried thereby. For example, in certain embodiments, transverse vibration-generating mechanism 82 may assume the form of a cantilevered weight supported by a spring or other resilient body, which deflects in lateral directions when DUT board 72 is rotated into the stop position and soft stop member 78 strikes soft stop member 80. Alternatively, as indicated in FIG. 5, transverse vibration-generating mechanism 82 may include a tubular body 84 containing a blind bore in which one or more ball bearings travel during rotation of DUT board 72. In this case, the ball bearings may be retained within tubular body 84 by sealing the bore with a plug member 86, which is threaded into the open end of the bore. When DUT board 72 is rotated into the stop position such that soft stop members 78, 80 contact, the ball bearings contained within transverse vibration-generating mechanism 82 strike one another and/or the interior walls of mechanism 82 in a manner producing the desired transverse vibrations.

There has thus been described multiple exemplary embodiments of a mechanized pulse-generating test apparatus, which can be utilized to carrying-out embodiments of MEMS stiction test method 10 described in conjunction with FIG. 1. In each of the above-described embodiments, the test apparatus includes a lever arm in the form of an elongated DUT board, which is rotated over predefined finite (e.g., arcuate) motion path or angular range of motion (ROM) to strike the fully articulating end of the DUT board against a soft stop member. This directs controlled shock pulses through a tested MEMS device (or devices) carried by the DUT board in an efficient and repeatable manner. In the above-described embodiments, transverse vibrations are further directed through the tested MEMS device in conjunction with application of the principal shock pulse, with the transverse vibration generated by impacting the rotatable DUT board against a soft stop member (e.g., soft stop member 64 shown in FIGS. 3 and 4) providing an appropriate motion response or wobbling action when struck or through the usage of a passive lateral vibrating-generating mechanism (e.g., transverse vibration-generating mechanism 82 shown in FIG. 5). In further embodiments of the MEMS stiction test method, the tested MEMS device (or devices) may be directed along a finite motion path having an alternative path geometry, the shock pulse may be generated in a different manner, and/or an active device may be employed to generate any desired transverse vibration motion or scrubbing action within the tested MEMS device. To help further emphasize this point, an additional exemplary embodiment of a MEMS stiction test apparatus suitable for carrying-out mechanized shock pulse MEMS stiction test method 10 (FIG. 1) will now be described in conjunction with FIG. 6.

Figure 6:
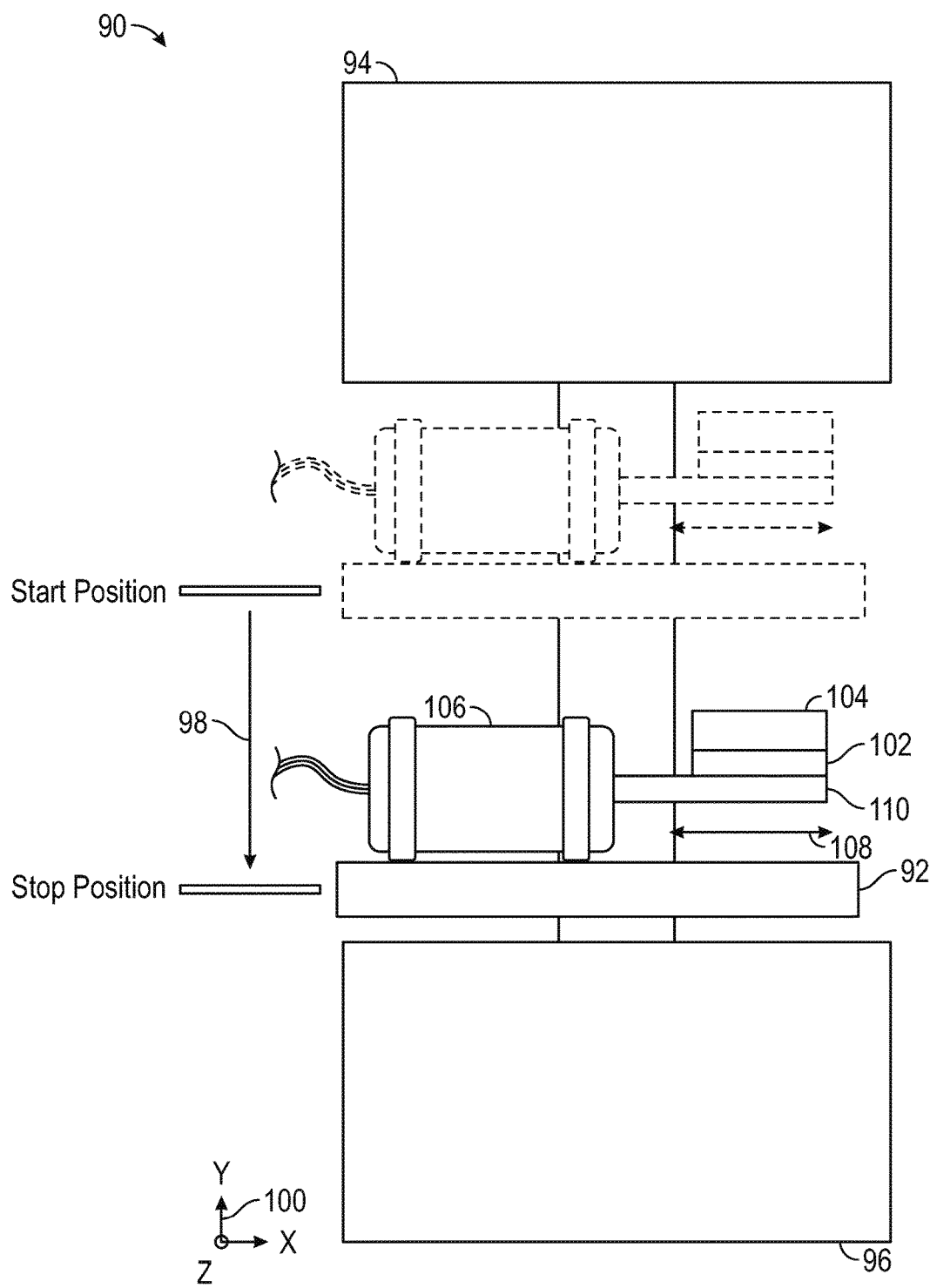
FIG. 6 is a schematic representation of a linear (e.g., voice coil-based) test apparatus, which includes an active transverse vibration-generating mechanism and which can be utilized to carry-out the MEMS stiction test method of FIG. 1 in a still further exemplary implementation thereof.

FIG. 6 a schematic representation of a linear motion MEMS stiction test apparatus 90, as illustrated in accordance with a still further exemplary embodiment of the present disclosure. In this particular example, MEMS stiction test apparatus 90 includes a DUT board 92 positioned between upper and lower portions 94 and 96 of a linear actuator 94, 96. DUT board 92 is movable by the linear actuator 94, 96 (e.g., a voice coil actuator) over a predefined linear ROM from a start position (shown in phantom) to a stop position, as indicated by arrow 98. The linear range of motion (ROM) of DUT board 92 may be oriented to extend parallel to a selected sense axis of a tested MEMS device when mounted to DUT board 92; e.g., the linear path over which DUT board 92 travels may extend parallel to the Z-axis identified in FIG. 6 by coordinate legend 100. Linear motion MEMS stiction test apparatus 90 further includes an I/O socket 102, which is located on or supported by DUT board 92 and into which a tested MEMS device 104 (e.g., a 3-axis MEMS accelerometer) can be plugged or inserted. An active transverse vibration-generating mechanism 106, such as a solenoid or another electromechanical linear actuator, is further mounted on DUT board 92 and includes a reciprocating arm 110 supporting I/O socket 102.

Lateral vibration-generating mechanism 106 is controlled to rapidly reciprocate arm 110, I/O socket 102, and tested MEMS device 104 along at least one axis perpendicular to the Z-axis. For example, as indicated in FIG. 6 by double-headed arrow 108, transverse vibration-generating mechanism 106 may rapidly reciprocate MEMS device 104 along the Y-axis as DUT board 92 is moved along the Z-axis of device 104. During shock pulse generation, DUT board 92 is moved rapidly from the start position to the stop position and then abruptly halted when reaching the stop position by action of linear actuator 94, 96 to generate a primary shock pulse directed through tested MEMS device 104 along the Z-axis (or other selected sense axis of device 104). Concurrently, transverse vibration-generating mechanism 106 reciprocates arm 110 to direct controlled transverse vibrations through MEMS device 104 and thereby induce the desired scrubbing action within device 104. This process is then repeated (DUT board 92 is repeatedly translated along the Z-axis) to direct a series of shock pulses through MEMS device 104 and complete MEMS stiction test method 10 (FIG. 1), as previously described. In further embodiments, transverse vibration-generating mechanism 106 may move MEMS device 104 along a different axis in the X-Y plane to generate the desired lateral vibratory motion within device 104.

There has thus been provided methods utilizing a highly controlled, mechanized pulse generation approach for evaluating the likelihood of stiction in MEMS accelerometers and other MEMS devices containing movable structures susceptible stiction. During the above-described test process, a mechanized test apparatus is utilized to generate a series of controlled shock pulse, which are transmitted through a tested MEMS device. In certain embodiments, the test apparatus directs the MEMS device along a defined path of travel from a start point to a stop point in a manner generating a highly controlled shock pulse. The output of the tested MEMS device is monitored during to determine whether stiction occurs over a number of trials. Additionally, transverse or lateral vibratory motion may also be applied to the tested MEMS device to favorably increase the likelihood of stiction when testing highly sticky MEMS devices. Thus, in certain embodiments of the MEMS stiction test, the test apparatus is further equipped with a specialized device that functions to generate transverse vibrations in conjunction with transmission of the primary shock pulse through the tested MEMS device. The transverse vibration-generating mechanism may be mounted a DUT board, such as a PCB, which carries the tested MEMS device through its desired path of travel. The end result is a highly accurate test for evaluating MEMS stiction that can be performed on a repeated basis in an efficient manner.

In one embodiment, the above-described MEMS stiction test method includes the step or process of loading a MEMS device, such as a multi-axis MEMS accelerometer, into a socket or I/O interface provided on a DUT board. After loading the MEMS device into the socket, a series of controlled shock pulses is then generated and transmitted through the MEMS device utilizing a mechanized test apparatus. Output data is then collected from the MEMS device and analyzed to determine whether stiction of the MEMS device occurs during each of the series of controlled shock pulses. In certain implementations, the series of controlled shock pulses can be generated by controlling the mechanized test apparatus to move the DUT board in a manner repeatedly directing the MEMS device along a predefined constrained motion path, such as an arcuate or linear motion path. The DUT board may be driven against a stop member located at a stop position of the motion path, such as a soft stop member including at least one layer of a compressible material (e.g., a ballistic gel or other viscoelastic material), which produces transverse vibrations detectable by the MEMS device when struck by the DUT board. In other implementations, the series of shock pulses may each propagate through the MEMS device primarily along an axis aligned with a first sense axis of the MEMS device. Concurrently, lateral or transverse vibrations may be through the MEMS device along at least a second sense axis of the MEMS device, which is perpendicular to the first sense axis.

In another embodiment, the above-described MEMS stiction test method includes the step or process of loading a MEMS device into a socket provided on a movable DUT board, which is resiliently biased toward contact with a stop member positioned in a rotational path of the DUT board. The DUT board is rotated to a predetermined angle, as taken about the rotational axis and measured from a start position in which the DUT board contacts the stop member. The DUT board is then released to allow the DUT board to rotate into contact with the stop member and generate a shock pulse transmitted through the MEMS device. An output of the MEMS device is then monitored to determine whether stiction of the MEMS device pursuant to transmission of the shock pulse through the MEMS device. In one implementation wherein the MEMS device has a first sense axis, the DUT board and stop member are positioned such that the MEMS device travels in a direction substantially parallel to the first sense axis when the DUT board rotates into contact with the stop member. If desired, transverse vibrations may also be directed through the MEMS device and along a second sense axis concurrently with transmission of the shock pulse through the MEMS device.

Embodiments of a mechanized shock pulse test apparatus for testing stiction in a MEMS device have further been disclosed. In one embodiment, the mechanized shock pulse test apparatus includes a DUT, which is movable over predefined motion path having a start position and a stop position. An actuator, such as a linear or rotary actuation, is mechanically coupled to the DUT board and controllable to move the DUT board over the predefined motion path. A socket or I/O interface is located on the DUT board and into which a MEMS device can be inserted such that a controlled shock pulse is directed through the MEMS device when loaded into the socket and the DUT board is moved over the predefined motion path into the stop position. In certain implementations, the DUT board is rotatable about a rotational axis to direct the MEMS device over an arcuate motion path. In other implementations, the actuator is a linear actuator configured to move the DUT board over a linear motion path.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for testing stiction in Microelectromechanical Systems (MEMS) devices, the method comprising:
   loading a MEMS device into a socket provided on a Device-Under-Test (DUT) board of a mechanized test apparatus, the DUT board having a first end portion and a second end portion, the socket being located on the first end portion and a shaft being joined to the second end portion of the DUT board in a rotationally fixed relationship;
   after loading the MEMS device into the socket, generating a series of controlled shock pulses transmitted through the MEMS device utilizing the mechanized test apparatus, wherein the generating operation comprises controlling the shaft to move the shaft and the DUT board in a manner that repeatedly directs the MEMS device along a predefined motion path from a start position to a stop position to generate the series of controlled shock pulses, and wherein the controlling operation comprises controlling the mechanized test apparatus to rotate the shaft and the DUT board about a rotational axis to direct the MEMS device along a predefined arcuate motion path, the rotational axis being aligned with and centered at the shaft; and
   monitoring an output of the MEMS device to determine whether stiction of the MEMS device occurs during each of the series of controlled shock pulses.

2. The method of claim 1 wherein generating comprises controlling the mechanized test apparatus to repeatedly drive the DUT board against a stop member to produce the series of controlled shock pulses, which are transmitted through the DUT board and to the MEMS device.

3. The method of claim 2 further comprising selecting the stop member to comprise at least one layer of a compressible material.

4. The method of claim 1 wherein generating comprises generating the series of controlled shock pulses to each propagate through the MEMS device primarily along an axis aligned with a first sense axis of the MEMS device.

5. The method of claim 4 further comprising, when generating each of the series of controlled shock pulses, directing transverse vibrations through the MEMS device along at least a second sense axis of the MEMS device perpendicular to the first sense axis.

6. The method of claim 4 wherein controlling comprises controlling the mechanized test apparatus to move the DUT board in a manner repeatedly directing the MEMS device along the predefined motion path having the stop position at which the direction of motion of the MEMS device is substantially parallel to the first sense axis.

7. The method of claim 1 further comprising directing transverse vibrations through the MEMS device, while concurrently transmitting the series of controlled shock pulses through the MEMS device.

8. The method of claim 7 wherein directing comprises repeatedly striking the DUT board against a soft stop member that exhibits a lateral vibratory response when struck by the DUT board.

9. The method of claim 7 wherein directing comprises equipping the DUT board with a passive transverse vibration-generating device, which converts a portion of each of the series of controlled shock pulses into transverse vibrations.

10. The method of claim 7 wherein directing comprises controlling an active lateral vibration-generating device carried by the DUT board to generate the transverse vibrations in conjunction with movement of the shaft and the DUT board over the predefined motion path.

11. The method of claim 10 wherein the active lateral vibration-generating device reciprocates the MEMS device as the DUT board is moved over the predefined motion path.

12. A method for testing stiction in a Microelectromechanical systems (MEMS) device, the method comprising:
   loading a MEMS device into a socket provided on a Device-Under-Test (DUT) board of a mechanized test apparatus, the DUT board having a first end portion and a second end portion, the socket being located on the first end portion and a shaft being joined to the second end portion of the DUT board in a rotationally fixed relationship, the DUT board being biased toward contact with a stop member positioned in a rotational path of the DUT board;
   rotating the shaft and the DUT board about a rotational axis to a predetermined angle to place the DUT board in a start position, the rotational axis being aligned with and centered at the shaft;
   releasing the DUT board to allow the DUT board to rotate into contact with the stop member and generate a shock pulse transmitted through the MEMS device; and
   monitoring an output of the MEMS device to determine whether stiction of the MEMS device has occurred in response to transmission of the shock pulse through the MEMS device.

13. The method of claim 12 wherein the MEMS device has a first sense axis, and wherein the method further comprising positioning the DUT board and stop member such that the MEMS device is traveling in a direction substantially parallel to the first sense axis when the DUT board rotates into contact with the stop member.

14. The method of claim 13 wherein the MEMS device has a second sense axis perpendicular to the first sense axis, and wherein the method further comprises directing transverse vibrations through the MEMS device and along the second sense axis as the shock pulse is transmitted through the MEMS device.

15. A mechanized shock pulse test apparatus for testing stiction in a Microelectromechanical systems (MEMS) device, the mechanized shock pulse test apparatus comprising:
   a Device-Under-Test (DUT) board movable over a predefined motion path having a start position and a stop position, the DUT board having a first end portion and a second end portion;
   a socket located on the first end portion of the DUT board into which the MEMS device can be inserted;
   a shaft joined to the second end portion of the DUT board in a rotationally fixed relationship, wherein the shaft and the DUT board are rotatable about a rotational axis to direct the MEMS device over an arcuate motion path when the MEMS device is loaded into the socket, the rotational axis being aligned with and centered at the shaft;
   an actuator coupled to the shaft and controllable to move the shaft and the DUT board over the predefined motion path to the start position, wherein a controlled shock pulse is directed through the MEMS device when the shaft and the DUT board move from the start position over the predefined motion path into the stop position.

16. The mechanized shock pulse test apparatus of claim 15 further comprising a torsion spring coupled to the second end of the DUT board, the torsion spring being configured to bias rotation of the shaft and the DUT board toward the stop position.

17. The mechanized shock pulse test apparatus of claim 15 further comprising a position sensor configured to monitor an angular position of the shaft and the DUT board from the stop position to the start position.

18. The mechanized shock pulse test apparatus of claim 15 further comprising a controller operably coupled to the actuator, the controller being configured to command the actuator to move the shaft and the DUT board to the start position.

* * * * *